(12) United States Patent
Klein

(10) Patent No.: US 6,671,384 B1
(45) Date of Patent: Dec. 30, 2003

(54) APPARATUS HAVING AN ELECTROACOUSTIC TRANSDUCER MOUNTED ON A P.C. BOARD WITH THE AID OF A HOLDING MEANS

(75) Inventor: Erich Klein, Himberg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/533,490

(22) Filed: Mar. 23, 2000

(30) Foreign Application Priority Data

Mar. 25, 1999  (EP) ............................................. 99890107

(51) Int. Cl.⁷ ........................... H04R 9/06; H04M 1/00; H04M 9/00; A47G 19/08
(52) U.S. Cl. ................. 381/409; 455/575.1; 455/575.4; 379/433.02; 211/41.17
(58) Field of Search ........................... 381/87, 409, 410, 381/411; 455/575.1, 575.4, 575.8, 530.1; 379/433.02, 433.03, 420.02, 420.03; 211/41.17

(56) References Cited

U.S. PATENT DOCUMENTS 5,285,353 A * 2/1994 Buck et al. .................. 361/732

6,374,120 B1 * 4/2002 Krauss ..................... 455/550.1

FOREIGN PATENT DOCUMENTS

| WO | 9838832 | 9/1998 | ............. H04R/1/06 |
| WO | WO9838832 | * 9/1998 | ............. H04R/1/06 |

* cited by examiner

*Primary Examiner*—Minsun Oh Harvey
*Assistant Examiner*—Devona E Faulk
(74) *Attorney, Agent, or Firm*—Edward W. Goodman

(57) ABSTRACT

In an apparatus (1) having a housing (2) with a first housing wall (4) and having a printed circuit board (8) which extends parallel to the first housing wall (4), an electroacoustic transducer (10) is mounted on the printed circuit board (8) with the aid of a holder (14), the holder (14) being mounted so as to be movable transversely with respect to the printed circuit board (8) and a spring device (17) being provided to urge the holder (14) together with the transducer (10) towards the first housing wall (4) under a spring load, and a part of the holder (14), at the same time, forming a sealing device(15), which guarantees a nominal isolation between the front (11) and the rear (120 of the transducer (10).

7 Claims, 2 Drawing Sheets

APPARATUS HAVING AN ELECTROACOUSTIC TRANSDUCER MOUNTED ON A P.C. BOARD WITH THE AID OF A HOLDING MEANS

BACKGROUND OF THE INVENTION

1. Field of the Invention

The invention relates to an apparatus comprising a housing having a first housing wall provided with sound transmission aperatures; a printed circuit board accommodated in the housing and extending substantially parallel to the first housing wall; an electroacoustic transducer having a front and a rear; holding means connected to the printed circuit board and to the transducer, said holding means securing the transducer to the printed circuit board such that the front of the transducer faces the first housing wall in the area of the sound transmission apertures; and sealing means arranged between the first housing wall and the transducer, said sealing means achieving a nominal isolation between the front and the rear of the transducer.

2. Description of the Related Art

Such an apparatus is known as a commercially available mobile telephone in a plurality of variants. In the known apparatus, the holding means is formed by a pot-shaped holder which is fixedly connected to the printed circuit board and has a pot bottom wall adjoining the printed circuit board and intermediate contacts in the area of the pot bottom wall, these intermediate contacts being in contacting engagement with terminal contacts of the transducer and with mating contacts on the printed circuit board. The pot-shaped holder has latching hooks which project in a direction from the pot bottom surface to the first housing wall and have latching noses at their free ends, these latching noses engaging over the transducer in order to retain the transducer and which, depending on the prevailing tolerance conditions, either lie on the first housing wall and, in the case of certain unfavorable tolerance conditions, cause the printed circuit board to be urged away from the first housing wall, which is undesirable, and, in the case of other unfavorable tolerance conditions, do not lie on the first housing wall, which would result in undesirable air gaps if no separate sealing means had been provided, this sealing means precluding the formation of such air gaps and filling up the tangential clearances between the pot-shaped holder and the first housing wall left between the latching hooks. Thus, in the known apparatus, the mounting conditions are tolerance-dependent to a considerable extent and require a comparatively large amount of work in order to achieve a nominal isolation desired between the front and the rear of the transducer. This results in a comparatively large amount of work and, as a result, comparatively high cost.

SUMMARY OF THE INVENTION

It is an object of the invention to preclude the problems mentioned hereinbefore and to provide an improved apparatus in a simple manner and by simple means.

In order to achieve the afore-mentioned object, according to the invention, an apparatus as defined in the opening paragraph, is characterized in that the holding means is mounted so as to be movable with respect to the printed circuit board parallel to a direction which extends transversely to the printed circuit board, and the apparatus further comprises spring means for urging the holding means towards the first housing wall under spring load, the holding means being held against the first housing wall with the aid of the spring means, wherein the holding means, at the same time, forms the sealing means.

By providing the characteristic features in accordance with the invention, it is achieved, in a particularly simple manner and by very simple means, that, firstly, an electroacoustic transducer is mounted securely to the printed circuit board of an apparatus in accordance with the invention and, secondly, always a correct nominal isolation between the front and the rear of the transducer is achieved with the aid of the holding means which is present anyway and which is in addition, used as sealing means, thereby always guaranteeing a correct and reproducible acoustic behavior and, thirdly, the means required for this purpose entail hardly any additional cost.

In an apparatus in accordance with the invention, separate spring means may be provided. However, it has proven to be advantageous when, in addition, the spring means is formed by two resilient terminal contacts of the transducer, which resiliently engage with two mating contacts on the printed circuit board, because the resilient terminal contacts of a transducer, which are present anyway, are thus utilized at the same time as spring means.

In an apparatus in accordance with the invention, it has proven to be particularly advantageous when, in addition, the holding means has at least two latching hooks which, extend through the printed circuit board and which have latching noses which engage behind the printed circuit board, because this guarantees a particularly simple mounting and securing of the holding means together with the transducer onto the printed circuit board as well as an easy removal.

In an apparatus in accordance with the invention, the transducer may be connected to the holding means, for example, with the aid of an adhesive joint. However, it has proven to be advantageous when, in addition, the holding means has further latching means for securing the transducer to the holding means, because this enables the transducer to be mounted simply in the holding means and it also enables the transducer to be removed in a simple manner, for example in order to replace the transducer.

The holding means may have various constructions. However, in practice, it has proven to be particularly advantageous when, in addition, the holding means has an upper wall which extends parallel to the first housing wall and has at least one passage for the transmission of sound, the upper wall being adapted to abut against the first housing wall, and forming the sealing means. Such a construction has proved to be advantageous both as regards its simplicity and as regards an optimum isolation between the front and the rear of a transducer of an apparatus in accordance with the invention.

In an apparatus in accordance with the invention including a holding means having an upper wall, it has further proven to be advantageous when, in addition, the upper wall has a plurality of passages for the transmission of sound, the passages being adapted to influence the sound pressure versus frequency response obtainable by means of the transducer, because the holding means with its upper wall is then additionally used for influencing the sound pressure versus frequency response.

In an apparatus in accordance with the invention, it has further proven to be advantageous when, in addition, the upper wall of the holding means forms a part of a holder cap forming the holding means, and the circumferential boundary of the holder cap is formed by the latching hooks and the latching means, because this results in a holding means which guarantees a high degree of protection for the transducer.

The above-mentioned as well as further aspects of the invention will become apparent from the two examples of embodiments described hereinafter and will be elucidated with reference to these examples.

BRIEF DESCRIPTION OF THE DRAWINGS

The invention will now be described in more detail with reference to the drawings, which shows two embodiments given by way of example but to which the invention is not limited, in which.

DESCRIPTION OF THE PREFERRED EMBODIMENTS

Figure 1:
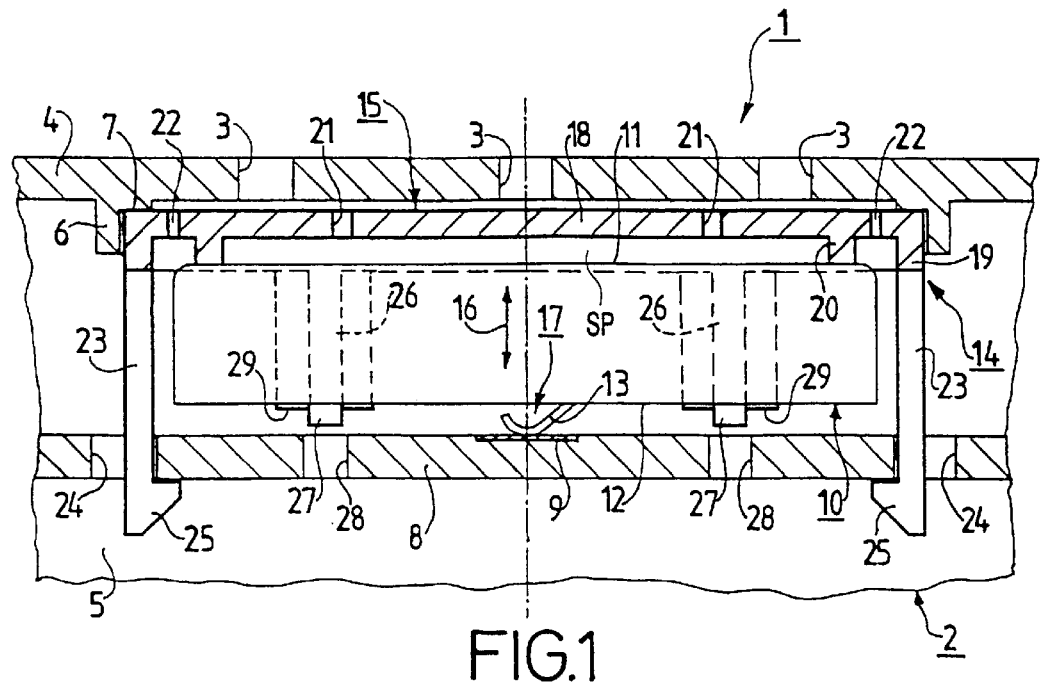
FIG. 1 is a sectional view showing a part of an apparatus in accordance with a first embodiment of the invention, in which a clearance between a first housing wall and a printed circuit board of the apparatus has an upper limit value of a tolerance range, and in which an electroacoustic transducer is secured between the first housing wall and the printed circuit board with the aid of a holding means.
Figure 2:
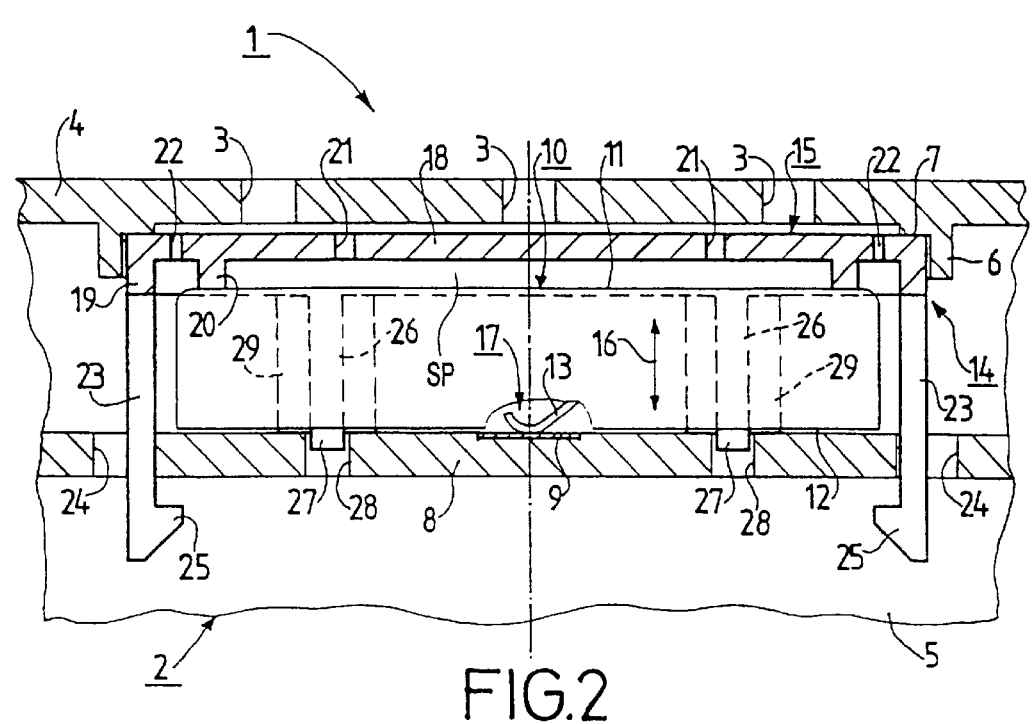
FIG. 2, in the same way as FIG. 1, shows the same part of the apparatus of FIG. 1, a clearance between the first housing wall and the printed circuit board having a lower limit value of a tolerance range.

FIGS. 1 and 2 show a relevant part of an apparatus 1. The apparatus 1 is a so-called mobile telephone. The apparatus 1 has a housing 2, of which FIGS. 1 and 2 show a first housing wall 4 provided with sound transmission apertures 3 and a second housing wall 5 which extends transversely to the first housing wall 4. The first housing wall 4 has an annular projecting portion 6 which projects from the first housing wall 4 into the interior of the housing 2. The annular projecting portion 6 has a shoulder 7.

The housing 2 accommodates a printed circuit board 8 arranged to extend parallel to the first housing wall 4 and secured inside the housing 2 by means, not shown. The printed circuit board 8 serves to accommodate at least a part of the circuit of the apparatus 1. The printed circuit board 8 is provided with conductor tracks in known manner but, for the sake of simplicity, these tracks are not shown in FIGS. 1 and 2. Only a conductor track portion 9, which serves as a mating contact, is shown. The printed circuit board 8 has two such conductor track portions 9, which form a mating contact each and which are arranged side by side. The two conductor track portions 9 are strip-shaped in the present case. However, such conductor track portions which serve as mating contacts may alternatively be formed by two mutually concentric annular conductor track portions.

The apparatus 1 includes an electroacoustic transducer 10. The transducer 10 is shown diagrammatically in FIGS. 1 and 2. The transducer 10 is of a construction as disclosed in International Patent Application WO 98/38832 A1, corresponding to U.S. patent application Ser. No. 09/033,200, filed Mar. 2, 1998. The subject matter disclosed in said patent document is incorporated in the present patent application by reference. The transducer 10 has a front 11 and a rear 12. FIGS. 1 and 2 show a resilient terminal contact 13 of the transducer 10. The transducer 10 has two such resilient terminal contacts 13, which are arranged side by side.

The apparatus 1 further includes holding means 14. The transducer 10 is connected to the holding means 14,. With the aid of the holding means 14 the transducer 10 is mounted on the printed circuit board 8 in such a manner that the front 11 of the transducer 10 faces the first housing wall 4 in the area of the sound transmission apertures 3.

The apparatus 1 further has sealing means 15 which is arranged between the first housing wall 4 and the transducer 10, and which serves to obtain a nominal isolation between the front 11 of the transducer 10 and the rear 12 of the transducer 10. The isolation provided by the sealing means 15 will be described in greater detail hereinafter.

In the apparatus 1, the holding means 14, which is connected to the printed circuit board 8, is advantageously mounted so as to be movable with respect to the printed circuit board 8 in a direction parallel to the direction 16 which extends transversely to the printed circuit board 8 and which is indicated by a double arrow in FIGS. 1 and 2. Furthermore, spring means 17 has been provided advantageously, which urges the holding means 14 towards the first housing wall 4 under spring load. The construction is such that the holding means 14 is held against the first housing wall 4 with the aid of the spring means 17, namely, in the area of the shoulder 7 of the annular projecting portion 6 of the first housing wall 4. As is apparent from FIGS. 1 and 2, the sealing means 14 abuts against the shoulder 7 of the annular projecting portion 6. As a result of this construction, the holding means 14, at the same time, forms the sealing means 15, namely, with a part of the holding means 14 to be described in detail hereinafter.

The holding means 14 is formed by a holder cap having an upper wall 18 and a short hollow cylindrical circumferential wall 19 which projects, from the upper wall 18 parallel to the direction 16,. Furthermore, a circular spacer ring 20 projects in a direction parallel to the direction 16 from the upper wall 18 of the holder cap forming the holding means 14, the front 11 of the transducer 10 abutting against said spacer ring. In this way, the upper wall 18 of the holding means 14 and the spacer ring 20, as well as the front 11 of the transducer 10, bound a space SP which forms an essential part of the so-called front volume of the transducer 10.

The upper wall 18 of the holding means 14 has a plurality of passages 21 for the transmission of sound. In the present case, four such passages 21 have been provided. Alternatively, another number is possible. The diameter of the passages 21 has been selected in such a manner that the passages 21 are suitable for influencing the sound pressure versus frequency response obtainable by means of the transducer 10. The passages 21 have been provided inside the spacer ring 20. The passages 21 serve to provide the acoustic communication between the front volume of the transducer 10, of which the space SP forms a part, and the acoustic free space situated in front of the upper wall 18 of the holding means 14.

In addition, the upper wall 18 of the holding means 14 has further passages 22 situated outside the spacer ring 20. In the present case, approximately fifty of such further passages 22 have been provided. The passages 22 also serve to influence the sound pressure versus frequency response obtainable by means of the transducer 10 by an appropriate dimensioning of their diameters. The further passages 22 serve to provide the acoustic communication between the so-called rear volume of the transducer 10 and the acoustic free space situated in front of the upper wall 18 of the holding means 14.

The holder cap forming the holding means 14 thus has an upper wall 18 which extends parallel to the first housing wall 4 and which has at least a passage 21 and 22 for the transmission of sound, the upper wall 18 being adapted to abut against the first housing wall 4, and also forming a part of the sealing means 15, the sealing means 15 formed by the upper wall 18 providing a nominal isolation between the front 11 of the transducer 10 and the rear 12 of the transducer 10 with the aid of its passages 21 and 22.

As stated, the holding means 14 is urged onto the first housing wall 4 with the aid of the spring means 17. In the present case, the spring means 17 is formed very simply and advantageously by the two resilient terminal contacts 13 of the transducer 10, which resiliently engage with the two mating contacts formed by conductor track portions 9 on the printed circuit board 8.

The holding means 14 comprises four latching hooks 23, of which two latching hooks 23 are shown in FIGS. 1 and 2. The latching hooks 23 project from the cylindrical circumferential wall 19 of the holding means 14 parallel to the direction 16 and extend through the printed circuit board 8 in the area of through-holes 24. By means of the latching hooks 23, the holding means 14 is mounted so as to be movable with respect to the printed circuit board 8 in the direction 16. The latching hooks 23 each have a latching nose 25 engaging behind the printed circuit board 8.

The holding means 14 further have further latching means which are formed by four further latching hooks 26, of which two latching hooks 26 are shown in FIGS. 1 and 2. The further latching hooks 26 also project from the circumferential wall 19 of the holding means 14 parallel to the direction 16 and each have a latching nose at their free ends. By means of the latching hooks 26, i.e., the latching noses 27, of the latching hooks 26, the transducer 10 is secured to the holding means 14. For each of the latching noses 27, the printed circuit board 8 has a through-hole 28 in which it is engageable with clearance.

A spacer 29 is connected to each of the further latching hooks 26. The spacers 29 serve to guarantee that there is always a minimum clearance between the rear 12 of the transducer 10 and the printed circuit board 8, for example, 0.1 mm, even when the clearance between the first housing wall 4 and the printed circuit board 8, as is shown in FIG. 2, has the lower limit value of a permissible tolerance range. In the situation illustrated in FIG. 2, the latching noses 27 of the further latching hooks 26 engage in the through-holes 28 in the printed circuit board 8.

Due to the advantageous construction of the holding means 14, it is achieved that in the apparatus 1 shown in FIG. 1, the transducer 10 is always reliably secured to the printed circuit board 8, and that always a correct nominal isolation is obtained between the front 11 of the transducer 10 and the rear 12 of the transducer 10 with the aid of the holding means 14 and the sealing means 15 formed by the upper wall 18 of the holding means 14, as a result of which a correct and reproducible acoustic behavior is obtained, even in the case of varying tolerance conditions. When the tolerance conditions in the apparatus 1 in accordance with the invention are as illustrated in FIG. 1, where the clearance between the first housing wall 4 and the printed circuit board 8 has an upper limit value of a tolerance range, the spring means 17 ensure that, via the transducer 10 and the spacer ring 20, the holding means 14 abuts against the shoulder 7 of the annular projecting portion 6 of the first housing wall 4, the latching noses 25 engaging against the printed circuit board 8. However, when the tolerance conditions in an apparatus 1 in accordance with the invention are as illustrated in FIG. 2, where the clearance between the first housing wall 4 and the printed circuit board 8 has a lower limit value of a given tolerance ranch, it is ensured that with the aid of the first housing wall 4, i.e., the shoulder 7 of the annular projecting portion 6 of the housing wall 4, that, via the holding means 14 and its spacer ring 20, the transducer 10 is moved so far up to the printed circuit board 8 against the force of the spring means 29 that the spacers 29 engage against the printed circuit board 8,. In each of the two cases it is guaranteed that the upper wall 18 of the holding means 14 abuts against the shoulder 7 of the annular projecting portion 6 of the first housing wall 4, as a result of which no undesired acoustic leaks occur and, consequently, always a correct nominal isolation between the front 11 of the transducer 10 and the rear 12 of the transducer 10 is guaranteed.

Figure 3:
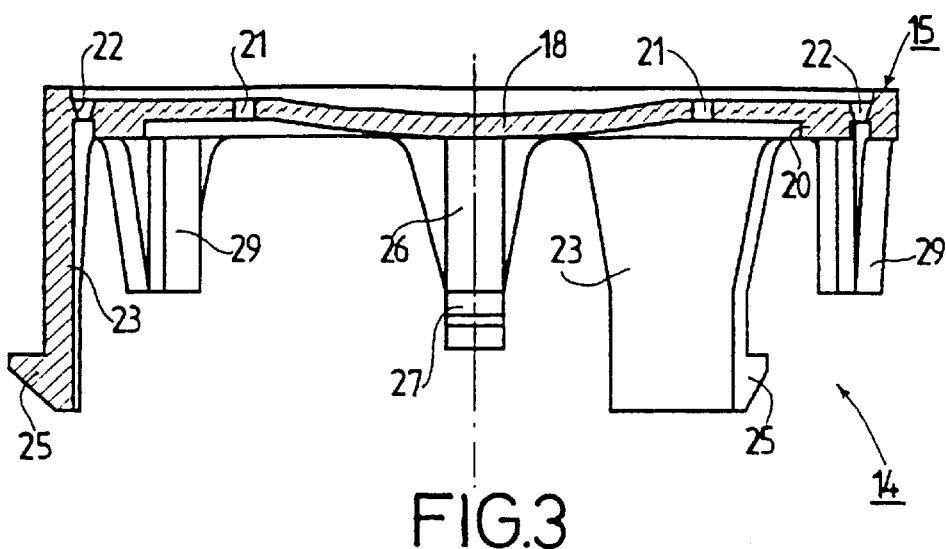
FIG. 3 is a sectional view which shows a holding means for an electroacoustic transducer of an apparatus in accordance with a second embodiment of the invention.
Figure 4:
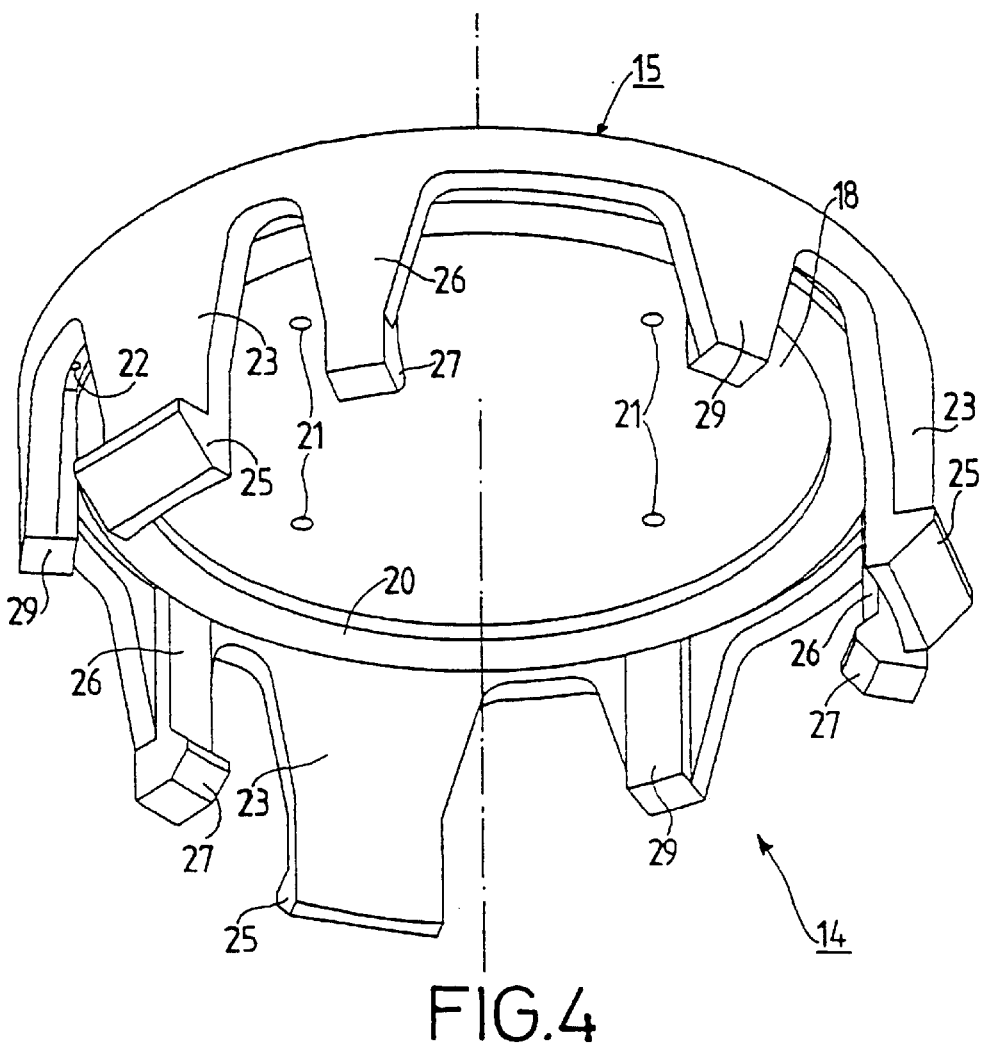
FIG. 4 is a three-dimensional representation which shows the holding means of FIG. 3 in an oblique underneath view.

FIGS. 3 and 4 show an apparatus 1 in a second embodiment of the invention. The holding means 14 has three angularly equi-spaced latching hooks 23 which each have a latching nose 24. The holding means 14 further has three angularly equi-spaced further latching hooks 26 which each have a latching nose 27. The holding means further has three angularly equi-spaced spacers 29.

The holding means 14 as shown in FIGS. 3 and 4 is also formed by a holder cap, the holding means 14 having an upper wall 18. The holding means 14, however, does not have a short hollow cylindrical circumferential wall, but the circumferential boundary of the holder cap forming the holding means 14 is formed by the latching hooks 23, the further latching hooks 26 and the spacers 29.

The upper wall 18 of the holding means 14 shown in FIGS. 3 and 4, is concave in its area situated between the passages 21. This has the advantage that the space formed between the upper wall 18 and the front 11 of a transducer mounted by means of the holding means 14 and, consequently, the front volume of this transducer, are comparatively small, which is advantageous for a satisfactory acoustic behavior.

The invention is not limited to the two embodiments described hereinbefore. An apparatus in accordance with the invention may also include differently constructed transducers. Moreover, separate spring means may be provided. Furthermore, instead of latching hooks other means may be used for securing the transducer, for example an adhesive joint provided between the front of a transducer and a spacer ring of the holding means. The two apparatuses in accordance with the invention described hereinbefore are so-called mobile telephones, but the measures in accordance with the invention may also be used advantageously in the other apparatus, for example, in so-called pocket dictation machines.

What is claimed is:

1. An apparatus comprising:

a housing having a first housing wall provided with sound transmission apertures;

a printed circuit board accommodated in the housing and extending substantially parallel to the first housing wall;

an electroacoustic transducer having a front and a rear;

holding means connected to the printed circuit board and to the transducer for securing the transducer to the printed circuit board such that the front of the transducer faces the first housing wall in the area of the sound transmission apertures; and sealing means arranged between the first housing wall and the transducer for achieving a nominal isolation between the front and the rear of the transducer, characterized in that the holding means is movably mounted with respect to the printed circuit board parallel to a direction extending transversely to the printed circuit board, and the apparatus further comprises spring means for urging the holding means towards the first housing wall under a spring load, the holding means being held against the first housing wall by the spring means, and the holding means, at the same time, forming the sealing means.

2. The apparatus as claimed in claim 1, characterized in that the spring means is formed by two resilient terminal contacts of the transducer, said two resilient terminal contacts resiliently engaging two mating contacts on the printed circuit board.

3. The apparatus as claimed in claim 1, characterized in that the holding means comprises at least two latching hooks for extending through the printed circuit board, said latching hooks having latching noses for engaging behind the printed circuit board.

4. The apparatus as claimed in claim 1, characterized in that the holding means further comprises latching means for securing the transducer to the holding means.

5. The apparatus as claimed in claim 1, characterized in that the holding means comprises an upper wall extending parallel to the first housing wall and having at least one passage for transmission of sound, said upper wall being adapted to abut against the first housing wall, whereby said upper wall forms the sealing means.

6. The apparatus as claimed in claim 5, characterized in that the upper wall has a plurality of passages for the transmission of sound, the passages influencing the sound pressure versus frequency response obtainable by the transducer.

7. The apparatus as claimed in claim 5, characterized in that the upper wall of the holding means forms a part of a holder cap forming the holding means, and a circumferential boundary of the holder cap is formed by the latching hooks and the latching means.

* * * * *